US009048258B2

(12) United States Patent  
Chang et al.

(10) Patent No.: US 9,048,258 B2  
(45) Date of Patent: *Jun. 2, 2015

(54) NARROW BODY FIELD-EFFECT TRANSISTOR STRUCTURES WITH FREE-STANDING EXTENSION REGIONS

(75) Inventors: Josephine B. Chang, Bedford Hills, NY (US); Michael A. Guillorn, Yorktown Heights, NY (US); Amlan Majumdar, White Plains, NY (US); Lidija Sekaric, Arlington, VA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/611,900

(22) Filed: Sep. 12, 2012

(65) Prior Publication Data

US 2013/0285126 A1    Oct. 31, 2013

Related U.S. Application Data

(62) Division of application No. 13/457,748, filed on Apr. 27, 2012, now Pat. No. 8,884,370.

(51) Int. Cl.  
*H01L 21/265* (2006.01)  
*H01L 29/78* (2006.01)  
*H01L 29/66* (2006.01)  
*H01L 29/786* (2006.01)

(52) U.S. Cl.  
CPC ........ *H01L 29/66772* (2013.01); *H01L 29/785* (2013.01); *H01L 29/78654* (2013.01)

(58) Field of Classification Search  
CPC .............................. H01L 29/78; H01L 21/265  
USPC .................. 257/192, 288, E21.334, E29.255; 438/163, 514  
See application file for complete search history.

(56) References Cited

U.S. PATENT DOCUMENTS

| | | | |
|---|---|---|---|
| 6,297,115 B1 | 10/2001 | Yu | |
| 6,448,167 B1 * | 9/2002 | Wang et al. | 438/595 |
| 6,512,273 B1 * | 1/2003 | Krivokapic et al. | 257/369 |
| 6,855,990 B2 | 2/2005 | Yeo et al. | |
| 6,933,577 B2 | 8/2005 | Cabral, Jr. et al. | |
| 7,112,535 B2 | 9/2006 | Coolbaugh et al. | |
| 2004/0198003 A1 | 10/2004 | Yeo et al. | |
| 2005/0189660 A1 * | 9/2005 | Bu et al. | 257/900 |
| 2008/0026518 A1 * | 1/2008 | Su et al. | 438/197 |
| 2008/0044979 A1 * | 2/2008 | Wells et al. | 438/424 |
| 2009/0053868 A1 * | 2/2009 | Nakamura et al. | 438/268 |
| 2009/0311836 A1 * | 12/2009 | Cartier et al. | 438/163 |
| 2010/0148217 A1 * | 6/2010 | Simonelli et al. | 257/192 |
| 2010/0184265 A1 * | 7/2010 | Maitra et al. | 438/303 |
| 2013/0210207 A1 * | 8/2013 | Fukuda et al. | 438/285 |

FOREIGN PATENT DOCUMENTS

WO    WO 2011064891 A1 *  6/2011

* cited by examiner

*Primary Examiner* — Kevin Parendo  
*Assistant Examiner* — Lamont Koo  
(74) *Attorney, Agent, or Firm* — Louis J Percello

(57) ABSTRACT

Narrow-body FETs, such as, FinFETs and trigates, exhibit superior short-channel characteristics compared to thick-body devices, such as planar bulk Si FETs and planar partially-depleted SOI (PDSOI) FETs. A common problem, however, with narrow-body devices is high series resistance that often negates the short-channel benefits. The high series resistance is due to either dopant pile-up at the SOI/BOX interface or dopant diffusion into the BOX. This disclosure describes a novel narrow-body device geometry that is expected to overcome the high series resistance problem.

14 Claims, 7 Drawing Sheets

NARROW BODY FIELD-EFFECT TRANSISTOR STRUCTURES WITH FREE-STANDING EXTENSION REGIONS

CROSS REFERENCE TO RELATED APPLICATION

This application is a divisional of co-pending application Ser. No. 13/457,748, filed on Apr. 27, 2012, and for which priority is claimed under 35 U.S.C. §120; the entire contents of which is are hereby incorporated by reference.

TECHNICAL FIELD

The present disclosure relates generally to complementary metal-oxide semiconductor field-effect transistors, and more particularly, to a narrow-body FET geometry.

BACKGROUND

Complementary metal-oxide semiconductor ("CMOS") field-effect transistors ("FETs") are employed in almost every electronic circuit application, such as signal processing, computing, and wireless communications. CMOS FETs have a gate that controls the flow of electrical current between the source and drain. Scaling down the gate length of both N-channel FETs (NFETs) and P-channel FETs (PFETs) in CMOS circuits to shorter dimensions leads to increased CMOS circuit speed. However, detrimental short-channel effects lead to high off-state leakage currents in CMOS devices, thereby increasing the power consumption. In case of extreme short-channel effects, CMOS circuits fail to operate.

FETs with multiple gates built on narrow bodies, such as, fin-shaped field effect transistors ("FinFETs") and trigates have better electrostatic integrity than thick-body partially-depleted silicon-on-insulator ("PDSOI") devices. However, narrow body devices on silicon-on-insulator ("SOI") suffer from high series resistance due to loss of doping from thin extension regions into the buried oxide ("BOX").

A known method to solve the doping loss problem is the use of advanced anneal techniques, such as millisecond laser spike anneal ("LSA") and flash anneal ("FLA"). These anneal techniques have a very small time scale to avoid dopant diffusion, and therefore, doping loss, and yet achieve high temperatures to electrically activate the dopants. Since very low energy implants are needed for thin body devices to avoid amorphization of the thin extension regions, the lack of any implant diffusion during LSA and FLA leads to very steep extension doping profiles with high chemical concentration exceeding the solid solubility limit near the surface of the thin extension region. Therefore, a significant fraction of the implanted dose, although present in the thin extension region, is not electrically active. Even though the thin-extension sheet resistance is significantly lowered upon using LSA/FLA instead of conventional spike rapid thermal annealing ("RTA"), it is not low enough and makes the FET series resistance high compared to that of PDSOI devices.

Therefore, a new method is desired where one can create an extension doping profile that is uniform in the thin extension region and does not suffer from doping loss to the BOX.

BRIEF SUMMARY

The present disclosure provides a method of fabricating narrow-body FET devices that have a uniform extension doping profile as well as novel narrow-body device geometry.

The narrow-body FET devices of the present disclosure overcome the high series resistance problems that often outweigh the short-channel benefits of most narrow-body devices because they do not suffer from dopant piling at the SOI/BOX interface, which is generally the case for n-type dopants such as As for NFETS, or encounter dopant diffusion into the BOX region, which is generally the case for p-type dopants such as B, for PFETs.

More particularly, the present disclosure relates to a method of fabricating a narrow-body SOI device comprising uniformly doped extension regions comprising:

(A) processing a narrow-body FET until extension implant regions are formed on both sides of a gate electrode;

(B) depositing a layer of oxide over the extension implant regions and a source and drain region of the narrow-body FET;

(C) forming a nitride spacer on both sides of the gate electrode by depositing a layer of nitride followed by a nitride RIE process that is selective to oxide;

(D) dipping the narrow-body FET into HF acid to create air gaps underneath the extension regions; and (E) performing spike rapid thermal annealing on the narrow-body FET.

The present disclosure also relates to a narrow-body SOI devices comprising:

(A) a substrate;
(B) uniformly doped extension regions;
(C) a gate electrode, wherein the gate electrode is separated from the substrate and uniformly doped extension regions by a first nitride space;
(D) air gaps in the substrate underneath the uniformly doped extension regions;
(E) a second nitride spacer; and
(F) a silicide layer.

Still other objects and advantages of the present disclosure will become readily apparent to those skilled in the art from the following detailed description, where it is shown and described only the preferred embodiment(s), simply by way of illustration of the best mode. As will be realized, the disclosure is capable of other and different embodiments, and its several details are capable of modification in various obvious respects, without departing from the disclosure. Accordingly, the description is to be regarded as illustrative in nature and not as restrictive.

DETAILED DESCRIPTION

Figure 1:
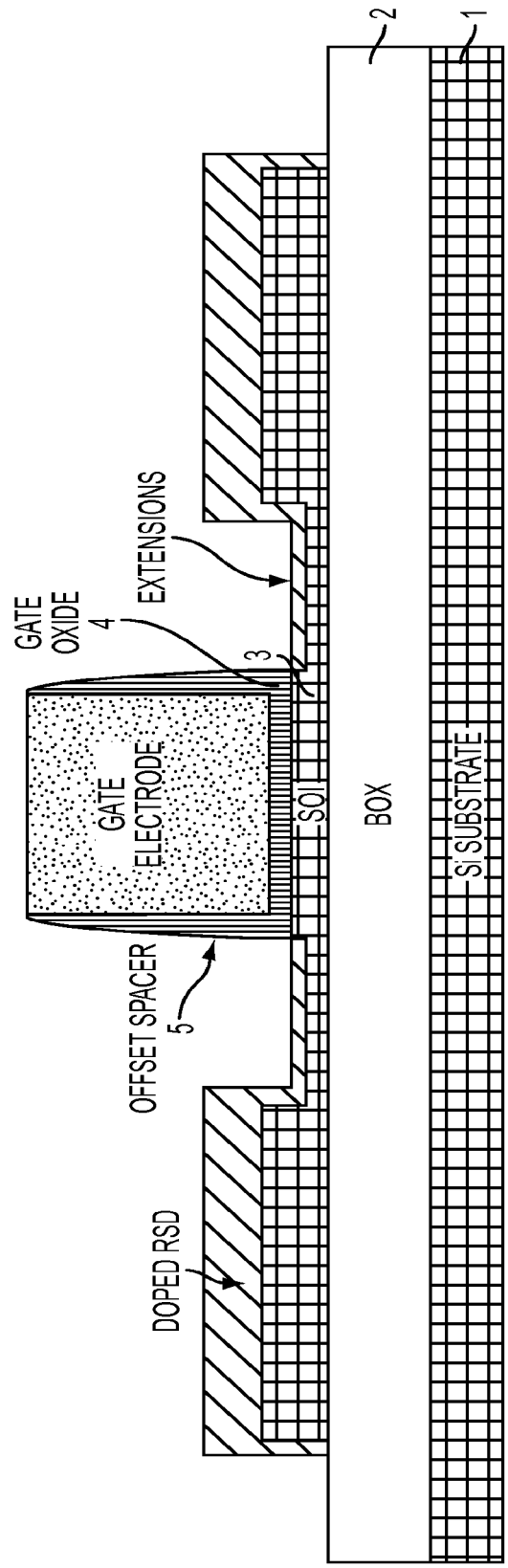
FIG. 1 is a cross-sectional view of a narrow-body FET after extension implants are formed.

The present disclosure, which is directed to a novel narrow-body device geometry that overcomes the high series resistance problems afflicting all narrow-body devices, and a method of fabricating these narrow-body FET devices, will now be described in greater detail by referring to the drawings that accompany the present application. It is noted that in the accompanying drawings, like reference numerals are used for describing like and/or corresponding elements.

The term "comprising" (and its grammatical variations) as used herein is used in the inclusive sense of "having" or "including" and not in the exclusive sense of "consisting only of." The terms "a" and "the" are used herein are understood to encompass the plural as well as the singular.

FIGS. 1-7 depict the steps used to fabricate a FinFET (i.e., a double gate metal-oxide-semiconductor FET ("MOSFET")) device in accordance with one embodiment of the invention. Using conventional and known FinFET or trigate processing techniques, a narrow body FET is processed until extension implants, as is depicted in FIG. 1. FIG. 1 is a cross-sectional view through the SOI fin region. In FIG. 1, a substrate, such as a silicon-on-insulator Separation by Implantation of Oxygen ("SIMOX") structure, is provided including a silicon substrate 1, a buried oxide ("BOX") layer 2 on top of the silicon substrate, and a silicon layer 3 on top of the buried oxide. The oxide layer 4 underneath the gate electrode is a hardmask in the case of FinFETs and is a gate oxide in the case of trigates. When the oxide underneath the gate in a two-dimensional figure, such as FIG. 1, is approximately twice as thick or more than the equivalent oxide thickness ("EOT") of the gate dielectric on the sidewalls, then the oxide underneath the gate is considered to be a hardmask. An oxide offset spacer 5 further surrounds the gate electrode.

Figure 2:
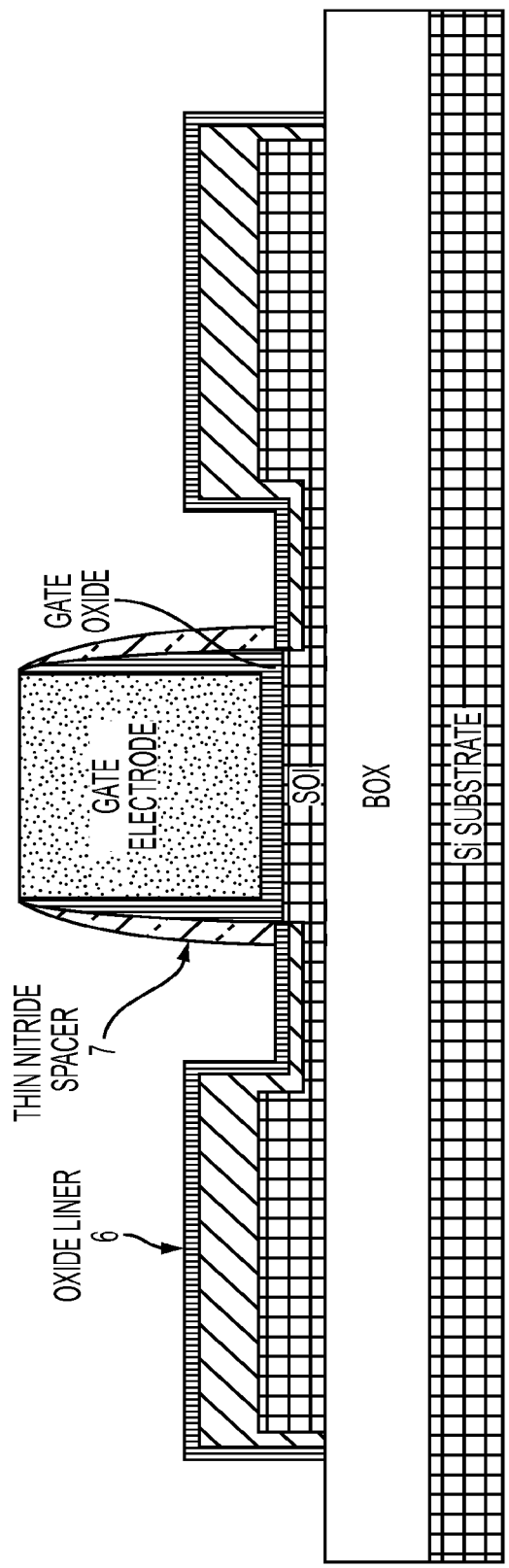
FIG. 2 is a cross-sectional view of a narrow-body FET depicted in FIG. 1 after the oxide liner is deposited and the nitride spacer formed.

As depicted in FIG. 2, a layer 6 of oxide (about 3-5 nanometers thick) is then deposited and followed by a nitride spacer 7 formation. The nitride spacer 7 formation includes the deposition of a thin layer of nitride (about 3-10 nanometers thick) followed by reactive ion etching ("RIE") that is selective to oxide and therefore stops on the oxide layer 6. The RIE is a nitride RIE that is selective to oxide and therefore stops on oxide. The formation of the nitride spacer 7 encapsulates the oxide offset spacer 5 as well as the oxide layer 4 underneath the gate electrode.

Figure 3:
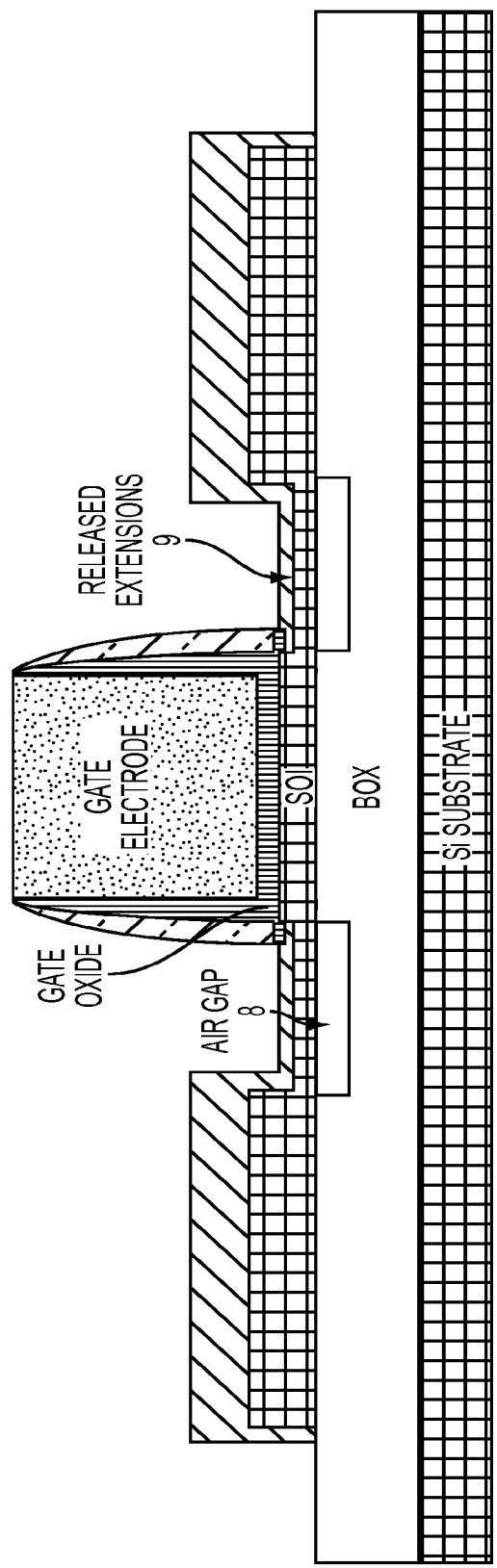
FIG. 3 is a cross-sectional view of a narrow-body FET depicted in FIG. 2 after being dipped in HF acid to release the extension regions.

Next, the entire wafer is then dipped in HF acid to create air gaps 8 underneath the extension regions 9, as is depicted in FIG. 3. The concentration of the HF acid used is approximately 100:1 (water:HF). The extension regions 9 are then released from the BOX layer 2 and are thus free-standing. The extension regions are released when the BOX layer 2 underneath the SOI region is etched away and an air gap remains under the extension regions 9.

Figure 4:
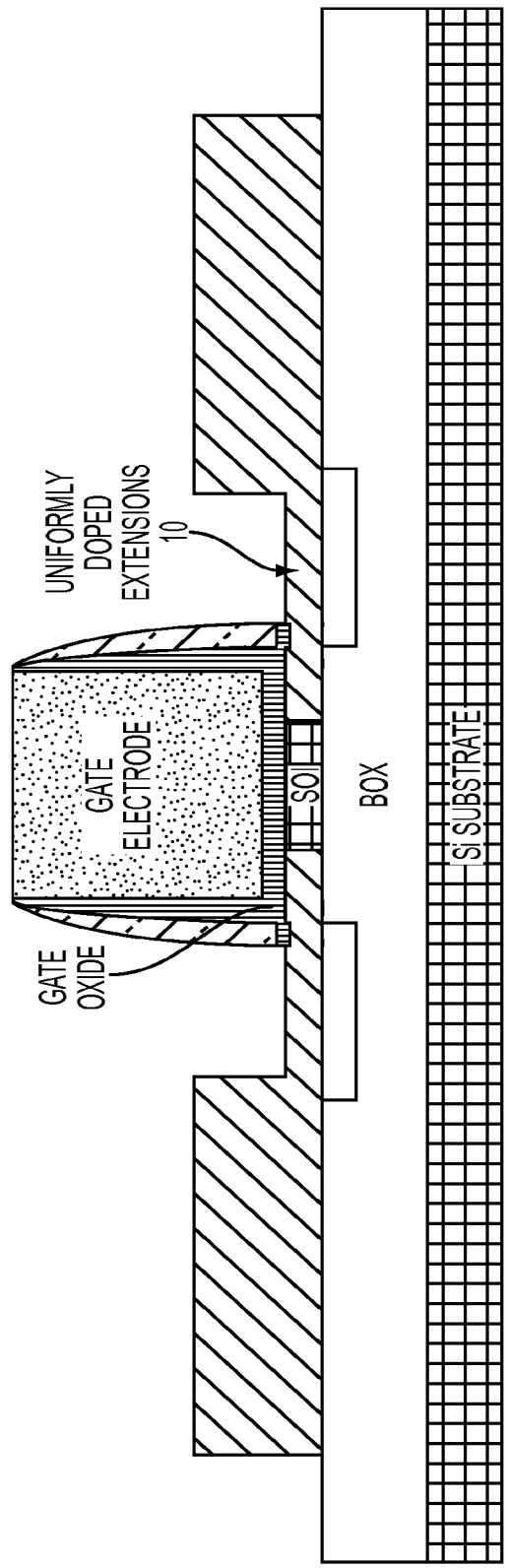
FIG. 4 is a cross-sectional view of a narrow-body FET depicted in FIG. 3 after rapid thermal annealing to create uniformly doped extension regions.

The wafer is then annealed using spike RTA, which creates uniformly-doped extension regions 10 due to diffusion, as showing in FIG. 4. For spike RTA, the temperature is approximately 1000-1100° C. and the time is approximately 1-5 seconds. Spike RTA is preferred over other annealing techniques, such as LSA and FLA. LSA and FLA lead to abrupt doping profiles, and therefore most dopants, while still in the SOI extension regions, are not electrically active using LSA and FLA. Spike RTA, however, provides uniformly-doped extension regions so that the resistivity of the extension is low and thus a low series resistance is obtained.

Since the extension regions 9 are not in contact with the BOX 2, no doping loss occurs from the extension regions 9 to the BOX 2. Normally, when thin body FETs built on SOI are annealed, extension doping, especially boron, will move out of the silicon and into the oxide because boron diffuses more quickly in oxide than in silicon. The nitride spacer 7 encapsulating the thin body prevents the dopants that are in the silicon from moving out of the silicon and into the oxide.

Figure 5:
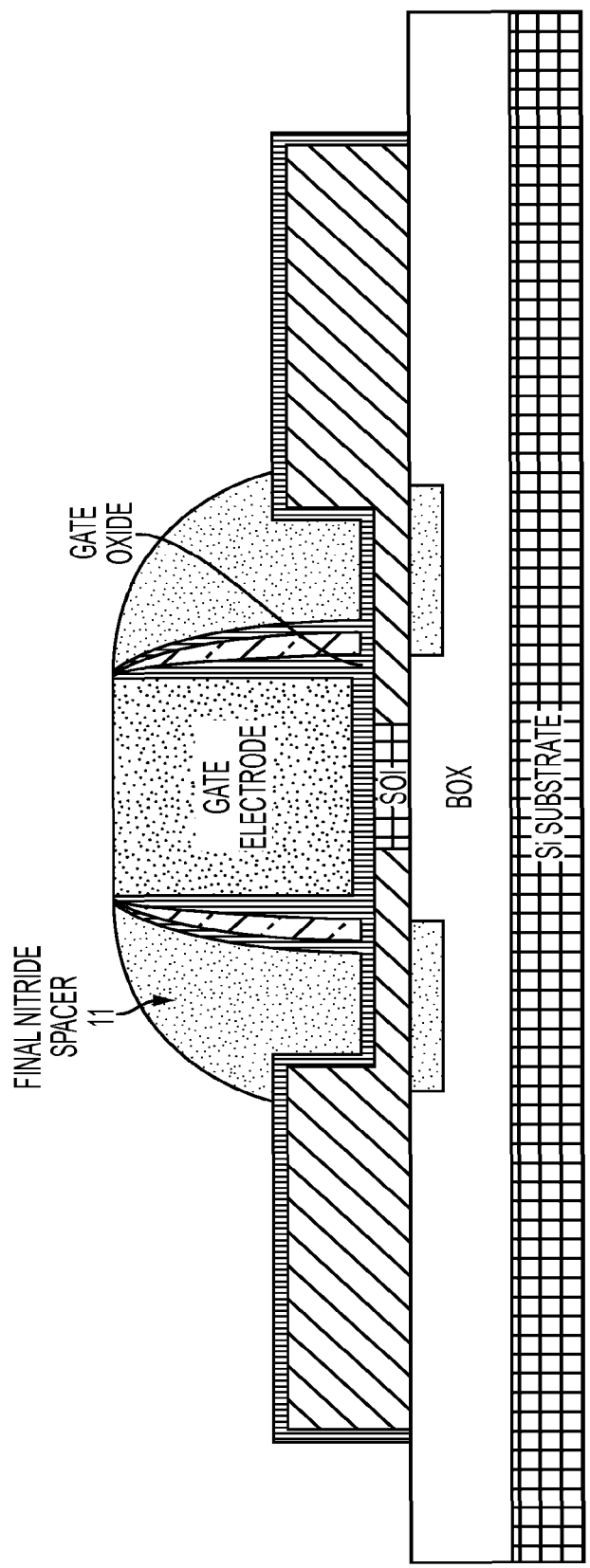
FIG. 5 is a cross-sectional view of a narrow-body FET depicted in FIG. 4 after the final nitride spacer is formed.
Figure 6:
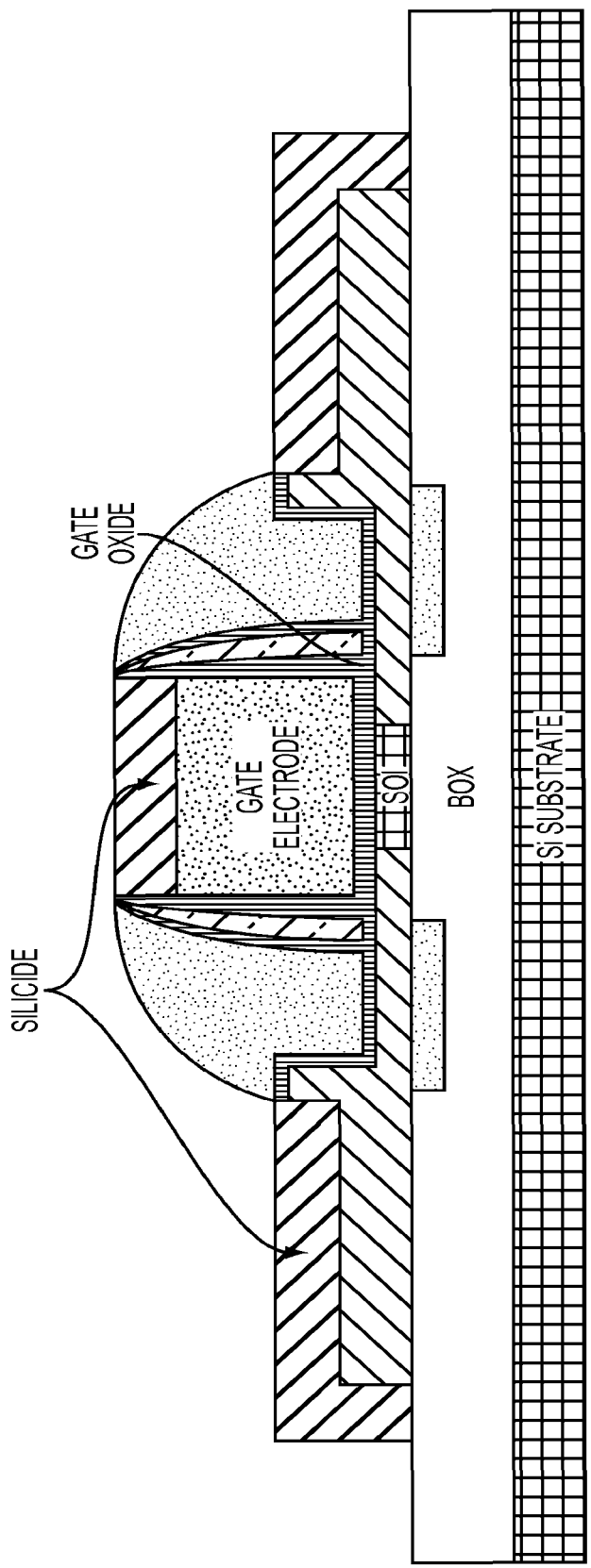
FIG. 6 is a cross-sectional view of a narrow-body FET depicted in FIG. 5 after the self-aligned silicide process.

The wafer is then processed like any conventional narrow-body FET using known methods beginning with the spacer formation for a self-aligned silicide process, as is showing in FIG. 6. A key difference, however, between the FinFETs or trigates formed by the method of the instant disclosure from conventional devices is that the nitride spacer 11 will fill up the air-gap underneath the extensions as shown in FIG. 5.

Figure 7:
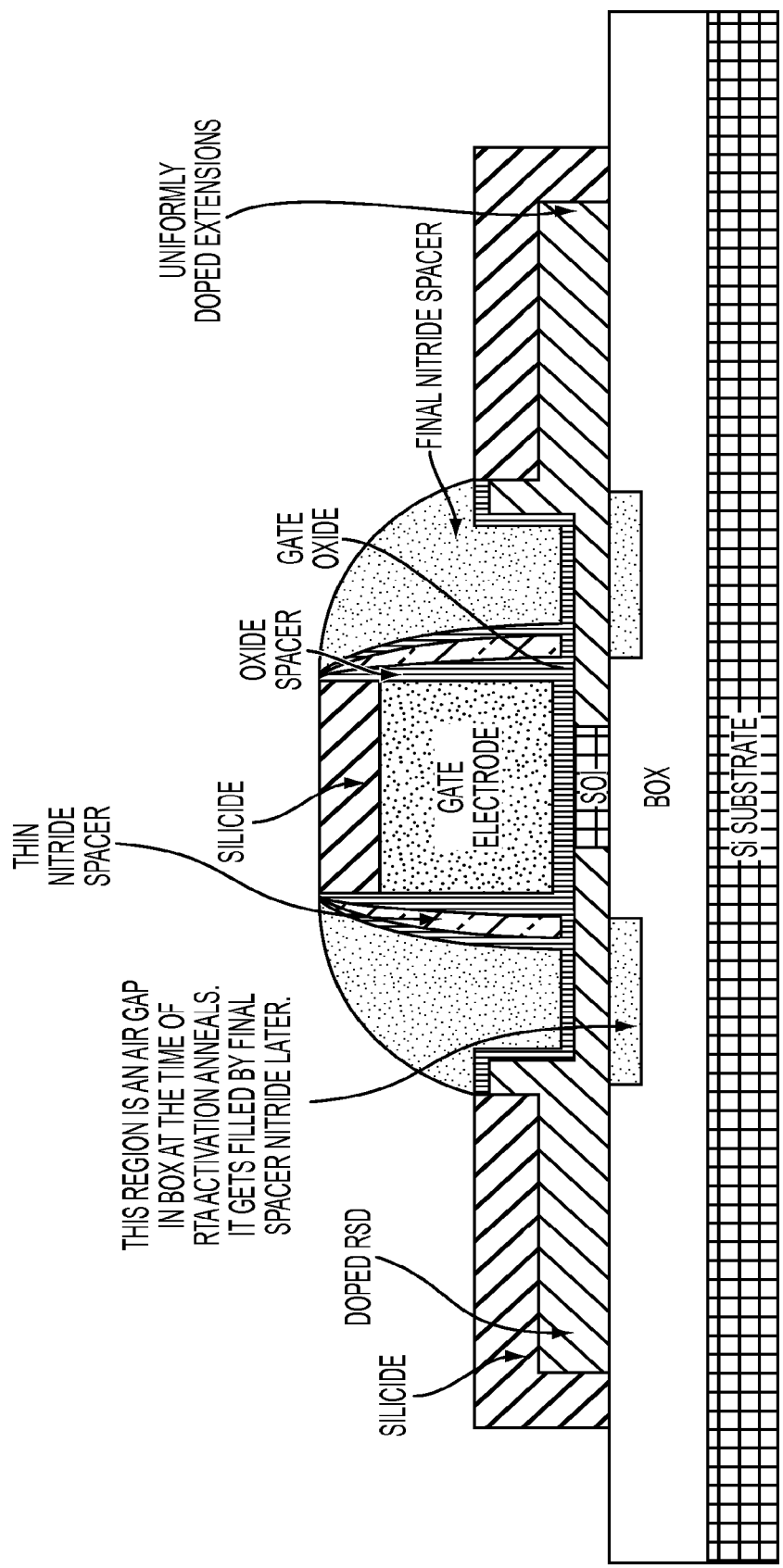
FIG. 7 is a cross-sectional view of an embodiment of the device of the present disclosure.

A cross-sectional view of the resulting device is depicted in FIG. 7.

The foregoing description illustrates and describes the disclosure. Additionally, the disclosure shows and describes only the preferred embodiment(s) but, as mentioned above, it is to be understood that it is capable to use in various other combinations, modifications, and environments and is capable of changes or modifications within the scope of the invention concepts as expressed herein, commensurate with the above teachings and/or skill or knowledge of the relevant art. The embodiments described herein above are further intended to explain best modes known by the applicants and to enable others skilled in the art to utilize the disclosure in such, or other, embodiments and with the various modifications required by the particular applications or uses thereof. Accordingly, the description is not intended to limit the invention to the form disclosed herein. Also, it is intended to the appended claims be construed to include alternative embodiments.

All publications and patent applications cited in this specification are herein incorporated by reference, and for any and all purposes, as if each individual publication or patent application were specifically and individually indicated to be incorporated by reference. In the event of an inconsistency between the present disclosure and any publications or patent applications incorporated herein by references, the present disclosure controls.

What is claimed is:

1. A method of fabricating a narrow-body SOI device comprising uniformly doped extension regions comprising:
   (A) processing a narrow-body FET until extension implant regions are formed on both sides of a gate electrode, wherein the narrow-body FET comprises a silicon substrate, a buried oxide layer on top of the silicon substrate, and a silicon layer on top of the buried oxide layer;
   (B) depositing a layer of oxide directly on the silicon layer over the extension implant regions and a source and drain region of the narrow-body FET, wherein the layer of oxide further surrounds the bottom of the gate electrode and extends to the sidewalls of the gate electrode, wherein the silicon layer of (A) is in direct contact with the layer of oxide that surrounds the bottom of the gate electrode;
   (C) forming on both sides of the gate electrode a nitride spacer that is separated from the silicon layer of (A) by a portion of the layer of oxide deposited in (B) by depositing a layer of nitride followed by a nitride RIE process that is selective to oxide;
   (D) dipping the narrow-body FET into HF acid to remove the oxide layer of (B) not covered by the nitride spacer of (C) and to create individual gaps located underneath the extension regions in the buried oxide layer, wherein the individual gaps are separated from each other by an intervening portion of the buried oxide layer lying beneath the gate electrode, so that the extension implant regions are free standing and not in contact with the buried oxide layer;
   (E) performing spike rapid thermal annealing on the narrow-body FET; and (F) forming a second nitride spacer that overlays the first nitride spacer and fills the individual gaps underneath the extension regions in the buried oxide layer with a nitride spacer.

2. The method of claim 1, wherein the layer of oxide is about 3-5 nanometers.

3. The method of claim 1, wherein the layer of nitride is about 3-10 nanometers.

4. The method of claim 1, comprising:
(D) dipping the narrow-body FET into HF acid, wherein the ratio of water to HF acid is 100:1.

5. The method of claim 1, comprising:
(D) dipping the narrow-body FET into HF acid for approximately 100 seconds.

6. A FinFET device produced by the method according to claim 1.

7. A trigate device produced by the method according to claim 1.

8. The method of claim 6, wherein the layer of oxide over the extension implant is a hardmask.

9. The method of claim 7, wherein the layer of oxide over the extension implant is a gate oxide.

10. The method of claim 1, further comprising forming an oxide offset spacer that surrounds the gate electrode.

11. The method of claim 10, wherein the oxide offset spacer is formed before (C) forming the nitride spacer on both sides of the gate electrode.

12. The method of claim 10, wherein the nitride spacer encapsulates the oxide offset spacer as well as an oxide layer underneath the gate electrode.

13. The method of claim 1, wherein the annealing using the spike rapid thermal annealing is carried out at a temperature of approximately 1000 to 1100° C.

14. The method of claim 13, where the spike rapid thermal annealing is carried out for 1 to 5 seconds at a temperature of approximately 1000 to 1100° C.

\* \* \* \* \*